United States Patent
Delfyett et al.

(10) Patent No.: US 6,314,115 B1
(45) Date of Patent: Nov. 6, 2001

(54) HYBRID WDM-TDM OPTICAL COMMUNICATION AND DATA LINK

(75) Inventors: Peter J. Delfyett, Geneva; Brian Mathason, Winter Park, both of FL (US)

(73) Assignee: University of Central Florida, Orlando, FL (US)

( * ) Notice: Subject to any disclaimer, the term of this patent is extended or adjusted under 35 U.S.C. 154(b) by 0 days.

(21) Appl. No.: 09/344,422

(22) Filed: Jun. 25, 1999

Related U.S. Application Data (63) Continuation-in-part of application No. 09/096,271, filed on Jun. 11, 1998, now Pat. No. 6,256,328.
(60) Provisional application No. 60/085,566, filed on May 15, 1998.

(51) Int. Cl.[7] .................. H01S 3/30; H04J 4/00; H04J 14/00; H04J 14/02; H04J 14/08

(52) U.S. Cl. .............. 372/6; 359/123; 359/124; 359/134; 359/135; 359/139; 385/14; 385/16; 370/378; 709/238

(58) Field of Search .................. 359/123, 124, 359/127, 135, 158, 134, 139, 189, 337, 341, 110, 161; 385/16, 14; 370/378; 372/6; 709/238

(56) References Cited

U.S. PATENT DOCUMENTS

| | | | |
|---|---|---|---|
| 4,435,809 | 3/1984 | Tsang et al. | 372/49 |
| 4,446,557 | 5/1984 | Figueroa | 374/45 |
| 5,115,444 | 5/1992 | Kirkby et al. | 372/50 |
| 5,210,764 | 5/1993 | Bucher et al. | 372/23 |
| 5,228,050 | 7/1993 | LaCourse et al. | 372/50 |
| 5,319,655 | 6/1994 | Thornton | 372/23 |
| 5,524,012 | 6/1996 | Wang et al. | 372/23 |
| 5,524,118 | 6/1996 | Kim et al. | 372/6 |
| 5,548,433 | 8/1996 | Smith | 359/158 |
| 5,561,676 | 10/1996 | Goldberg | 372/18 |
| 5,831,752 | * 11/1998 | Cotter et al. | 359/135 |
| 5,996,020 | * 11/1999 | Reed | 709/238 |
| 5,999,293 | * 12/1999 | Manning | 359/139 |
| 6,081,631 | * 6/2000 | Brindel et al. | 385/1 |

OTHER PUBLICATIONS

H. Shi, et al., Multiwavelength, 10 GHz Picosecond Pulse Generation from a Single–Stripe Semiconductor Traveling Wave Amplifier Using Active Modelocking in an External Cavity 1997, OSA TOPS on Ultrafast Electronics and Optoelectronics vol 13, p. 46–49.*

All–Optical Clock Recovery Using a Mode–Locked Laser, K. Smith and J.K. Lucek, *Electronics Letters*, Sep. 10, 1992, vol. 28. No.: 19, pp. 1814–1816.

Delfyett, et al., "High–Power Ultrafast Laser Diodes", IEEE Journal of Quantum Electronics, vol.28 No. 10, Oct. 1992.

(List continued on next page.)

*Primary Examiner*—Teresa M. Arroyo
*Assistant Examiner*—Cornelius H. Jackson
(74) *Attorney, Agent, or Firm*—Brian S. Steinberger; Law Offices of Brian S. Steinberger (57) ABSTRACT

A hybrid WDM-TDM optical link employing a hybrid modelocked multi-wavelength semiconductor which provides approximately 4 to approximately 20 wavelength channels that makes possible modulated multiplexed data which when demultiplexed by ultra fast optical demultiplexing provides rates suitable for conventional electronic photo receivers. The link uses single-stripe GaAs/AlGaAs semiconductor optical amplifiers which simultaneously generate from approximately four to more than approximately twenty tunable WDM channels. Diode laser can also include InP, InGaAlP, InGaAsP, InGaP, InGaAs. A four channel version transmits approximately 12 picosecond pulses at approximately 2.5 GHz for an aggregate pulse rate of 100 GHz. When generating approximately 20 wavelength channels, each transmitting approximately 12 picosecond pulses at a rate of approximately 600 MHz, there is provided optical data and transmission systems operating at rates in excess of 800 Gbits/s.

18 Claims, 8 Drawing Sheets

OTHER PUBLICATIONS

Zhu, et al. "Dual–Wavelength Picosecond Optical Pulse Generation Using an Actively Mode–Locked Multichannel Grating Cavity Laser", IEEE Photonics Technology Letters, vol. 6 No. 3, Mar., 1994.

Morioka, et al.,"Multi–WDM–Channel, Gbit/s Pulse Generation from a Single Laser Source Utilizing LD–Pumped Supercontinuum in Optical Fibers", IEEE Photonics Technology Letters, vol. 6, No. 3, Mar., 1994.

Chi–Luen Wong, et al. "Dual–Wavelength Actively Mode–Locked Laser–Diode Array with an External Grating–Loaded Cavity", Optics Letters, vol.19, No. 18, Sep., 1994.

Nuss, et al., "Dense WDM with Femtosecond laser Pulses," IEEE/LEOS 1994, 7th Annual Meeting, Boston, pp. 199–200 No Month.

Shi, et al., "4×2.5 –Gbit/s WDM–TDM Laser Source based on mode–loced semiconductor lasers," at Phontonic Processing Technology and Applictions Conference, CREOL, SPIE vol. 3075, p. 60, Apr. 21, 1997, pp. 60–64.

Gee, et al., "Intracavity Gain and Absorption Dynamics of Hybrid Modelocked Semiconductor Lasers Using Multiple Quantum Well Saturable Absorbers", American Institute of Physics, (Appl. Phys. Lett. 71, Nov., 1997.

Shi, et al., "20×5 Gbit/s Optical WDM Transmitter Using Single–stripe Multiwavelength Modelocked Semiconductor Laser", Electronics Letters, Jan. 1998.

Mathason, et al. "Multiwavelength All–Optical TDM Switching Using a Semiconductor Optical Amplifier in a Loop Mirror", IEE Photonics Technology Letters, vol. 11, No. 3, Mar. 1999.

* cited by examiner-

HYBRID WDM-TDM OPTICAL COMMUNICATION AND DATA LINK

This invention relates to an ultra-high speed data and communication link, and in particular to a hybrid WDM-TDM transmitter capable of simultaneously generating up to twenty or more tunable WDM channels using a single-striped Ga As/AlGaAs type semiconductor optical amplifier, and was funded in part by the National Science Foundation ECS contract number 9522267, and is a Continuation-in Part of U.S. patent application Ser. No. 09/096,271 filed Jun. 11, 1998, by the same assignee as the subject invention now U.S. Pat. No. 6,256,328 which claim benefit to provisional application 60/085,566 filed May 10, 1998.

BACKGROUND AND PRIOR ART

Ultra high speed data links will become wide spread with the deployment of broadband switched digital networks and services, e.g., teleconferencing, video telephony, and computer services. The key hurdle in the commercial development of these networks is the availability of cost effective photonic technologies that will speed up the generation, transmission and processing of these vast amounts of data. Present state of the art optical communications and signal processing rely on a wavelength division multiplexed (WDM) or a time division multiplexed (TDM) hardware platform.

Thus, hardware based on multiwavelength optical signal sources capable of generating ultrashort and highly synchronized picosecond pulses are of great interest in novel photonic networks utilizing combined optical wavelength division multiplexed (WDM) and time division multiplexed (TDM) data formats. To date, multiwavelength generation has been demonstrated by either using spectral filtering of femtosecond optical pulses, or semiconductor laser based devices. See Morioka et al., "Multi WDM-Channel pulse generation from a Single Laser Source utilizing LD-pumped Supercontinuum in Optical Fibers", PhotonTech. Lett., vol.6, no.3, 365~368, 1994; and Nuss et al. "Dense WDM with Femtosecond Laser Pulse ", IEEE/LOS 1994 Annual Meeting, Boston, Mass., 1994.

In these approaches, the main idea is to generate femtosecond optical pulses at a low channel pulse rate. These approaches generally suffer from limited wavelength channels, the need of high power laser source, system complexity, and low single channel rates.

Furthermore, there have been various patents of general interest in this area that also fail to overcome the problems described above. U.S. Pat. No. 4,435,809 to Tsang et al. describes a passively mode locked laser having a saturable absorber that only has a single wavelength operation mode, with multiple longitudinal modes. U.S. Pat. No. 4,446,557 to Figueroa describes a mode-locked semiconductor laser with tunable external cavity where a user adjusts the cavity length which modifies the longitudinal mode spacing to generate a single wavelength output. U.S. Pat. No. 5,115,444 to Kirkby et al. describes a multichannel cavity laser where each wavelength is generated from a common cavity with each wavelength experiencing a different optical path length. Simultaneous generation of each wavelength is not feasible since the gain competition in the final optical amplifier stage will complicate and prevent simultaneous multiwavelength generation. U.S. Pat. No. 5,228,050 to LaCourse et al. describes an integrated multiple-wavelength laser array, each wavelength having its own cavity that is length adjustable to allow lasing at different wavelengths, and requires an array of lasers for the multiple wavelength generation. U.S. Pat. No. 5,319,655 to Thornton describes a multiwavelength laterally-injecting type lasers which requires the sources to be precisely aligned to one another. U.S. Pat. No. 5,524,012 to Wang et al. describes a tunable, multiple frequency laser diode that uses a multistripe semiconductor laser array to generate several wavelengths, and requires a grazing incidence angle on the diffraction grating. Using the grazing incidence angle prevents simultaneous wavelength generation. U.S. Pat. No. 5,524,118 to Kim et al. describes a wavelength-varying multi-wavelength optical filter laser using a single pump light source, which requires using an erbium doped fiber amplifier. U.S. Pat. No. 5,561,676 to Goldberg describes a compound-cavity high power, tunable modelocked semiconductor laser, that generates a single wavelength output that does not allow for multiple wavelength generation.

Another problem with multichannel generation from femtosecond lasers is that the multiple channels are generated by spectrally filtering the laser output after the optical pulse is generated. This is inefficient because the filtering process eliminates, or throws away, energy that was used in making the optical pulse.

In approaches relying on the spectral filtering of supercontinuum generation, some wavelength channels may experience excess spectral incoherence, rendering them useless for data transmission.

SUMMARY OF THE INVENTION

The first objective of the present invention is to provide an ultra-high speed data and communication link based on an actively modelocked laser with multiple wavelength generation.

The second object of this invention is to provide an ultra-high speed photonic circuit based on multiwavelength generation from a semiconductor diode laser source.

The third object of this invention is to provide an ultra high-speed data and communication link based on generating multiwavelengths simultaneously from a single stripe semiconductor diode laser source.

The fourth objective is to provide a method for switching and routing multiple wavelengths simultaneously.

The subject invention hybrid WDM-TDM optical link includes a hybrid modelocked multiwavelength semiconductor laser that can simultaneously generate over 20 independent wavelength channels at rates greater than approximately 5 Gbits per second. Additionally, ultrafast optical demultiplexing that relies on an all optical clock recovery technique and nonlinear optical loop mirrors is used to demultiplex multiwavelength data down to rates suitable for electronic photoreceivers. The temporal duration of the optical pulses would mean that aggressive temporal interleaving can lead to optical data and transmission systems operating at rates in excess of approximately 800 Gbits per second, based solely on the semiconductor optical amplifier applications.

Further objects and advantages of this invention will be apparent from the following detailed description of a presently preferred embodiment which is illustrated schematically in the accompanying drawings.

BRIEF DESCRIPTION OF THE FIGURES

FIG. 2b shows a slit mask that can be used with the embodiment of FIG. 2a.

FIG. 3a show the spectral output of the multiwavelength modelocked diode laser of FIG. 2a.

FIG. 3b show the temporal output of the multiwavelength modelocked diode laser of FIG. 2a.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

Figure 1:
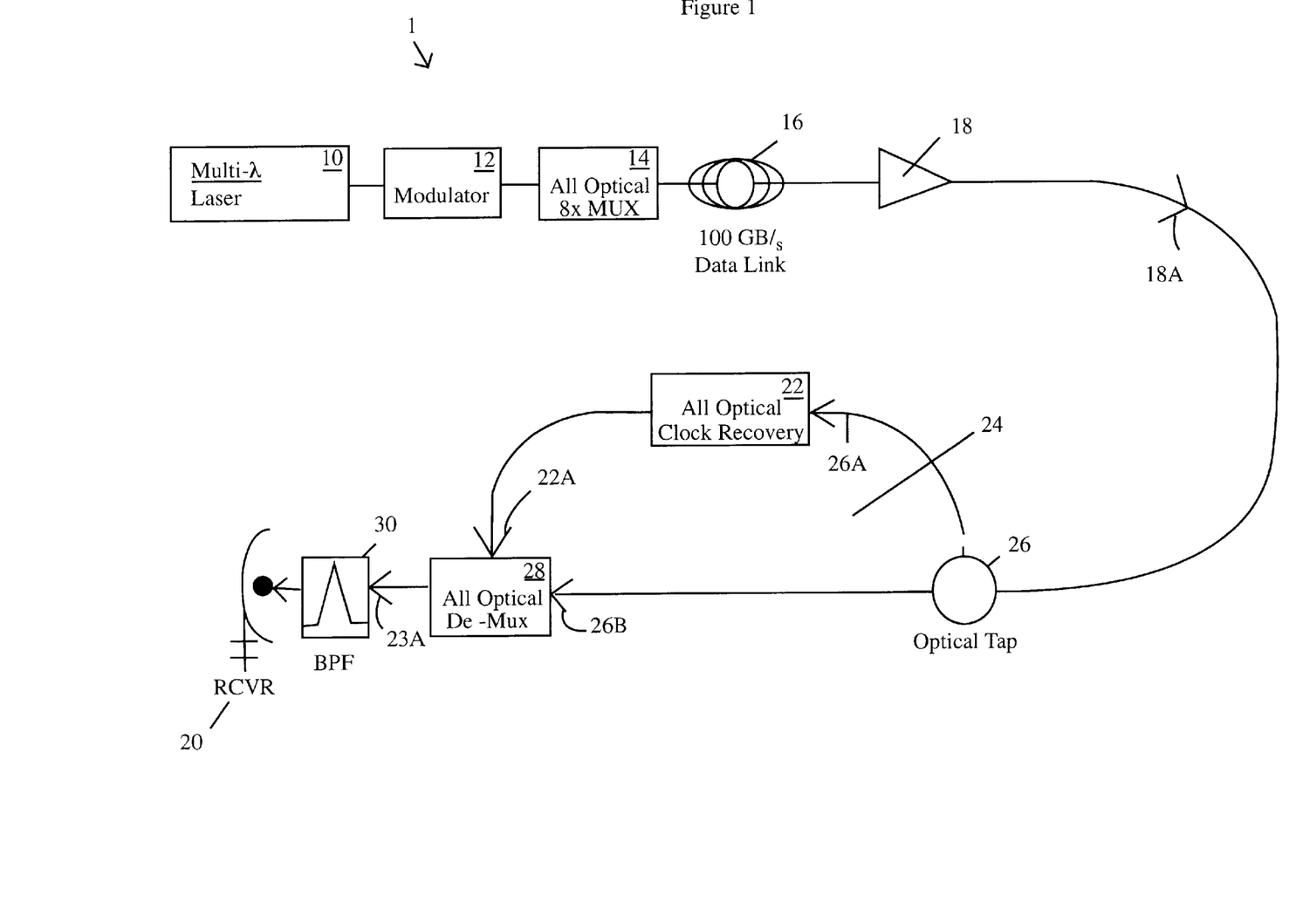
FIG. 1 is a schematic representation of the novel high speed hybrid WDM-TDM optical link.

FIG. 1 is a schematic of a setup 1 of a high speed hybrid WDM-TDM optical link, showing the multiwave transmitter (fully discussed and described with respect to FIGS. 2a and 2b) connected to an optical clock recovery oscillator and the all optical switch. The multi-wavelength laser transmitter features the multiwavelength modelocked semiconductor diode laser disclosed in parent U.S. patent application Ser. No. 09/096,271 filed Jun. 11, 1998, which is incorporated by reference.

Referring to FIG. 1, modulator 12 can be an electro-optic modulator such as a lithium niobium intensity modulator(by United Technologies, Inc.), and the like. Alternatively, modulator 12 can be semiconductor based modulator such as a semiconductor electro-absorption modulator, and the like. Optical multiplexer 14 can be wavelength division multiplexing devices such as an arrayed waveguide grating router (by PIRI, Inc.), a bulk diffractive grating devices (by Instruments SA, Inc.), and the like. Data link 16 can be a single optical fiber either single mode or multimode fiber, multiple fiber bundles(both coherent and incoherent), parallel optical busses(such as fiber by Corning), data links such as free-space propagation, and the like. Optical amplifier 18 can be a semiconductor optical amplifier, an erbium doped fiber, and the like. Tap 26 can be an optical fiber splitter, an optical coupler, an optical beamsplitter, and the like. Referring to FIG. 1, demultiplexer 28 is where the multiwavelength switching in the invention is occuring. Demultiplexer 28 can be an all optical switch such as a nonlinear optical interferometer, a lithium niobate electro-optic switch, and the like.

Referring to FIG. 1, the multiwave laser generator 10 is capable of generating up to 20 different wavelengths, each of which can be modulated by modulator 12, which enables data to be transmitted at a data rate of 5 Gbits/s. The data then passes through an all optical multiplexer 14 to a 100 Gbits/s data link 16 to an optical amplifier 18. Owing to the modelocked nature of the semiconductor laser, the optical data is transmitted in the R-Z format. The R-Z data format is also referred to as a return-to-zero data format, and is an optical data format that uses a pulse of light to represent a logical state. This is in contrast to a continuous light intensity to represent a logical state or non-return-to-zero data format NR-Z. The R-Z data format is relevant to the subject invention because the laser output light is in the return to zero format. R-Z data also offers advantages in all optical signal processing because it contains an RF spectral component at the clock frequency(which is not found in the NR-Z data format). At the receiver 20, the data is demultiplexed by employing an all-optical clock recovery oscillator 22 in conjunction with an ultrafast nonlinear optical loop 24 in conjunction with an optical tap 26 and an all optical demultiplexer 28 which utilizes a semiconductor optical amplifier as the nonlinear element. The data then goes to a bandpass filter element 30 before reaching the receiver 20. Owing to the temporal duration of the data bits (approximately 10 picoseconds or 10 to minus $11^{th}$ seconds), aggressive temporal interleaving of the data should allow for single wavelength channel data rates of approximately 40 Gbits/s, implying a total aggressive data transmission of approximately 840 Gbit/s from a single semiconductor laser diode. To achieve approximately 840 Gbits/s occurs by combining both the 21 independent wavelengths or WDM channels with the time division multiplexing or interleaving optical pulses of 10 picosecond pulses to single wavelength rates of approximately 40 GHz would imply a combined data rate of approximately 21×40 Gb/s or 840 Gb/s. Thus, this hybrid approach uses or combines both wavelength division multiplexing and time division multiplexing.

Figure 2A:
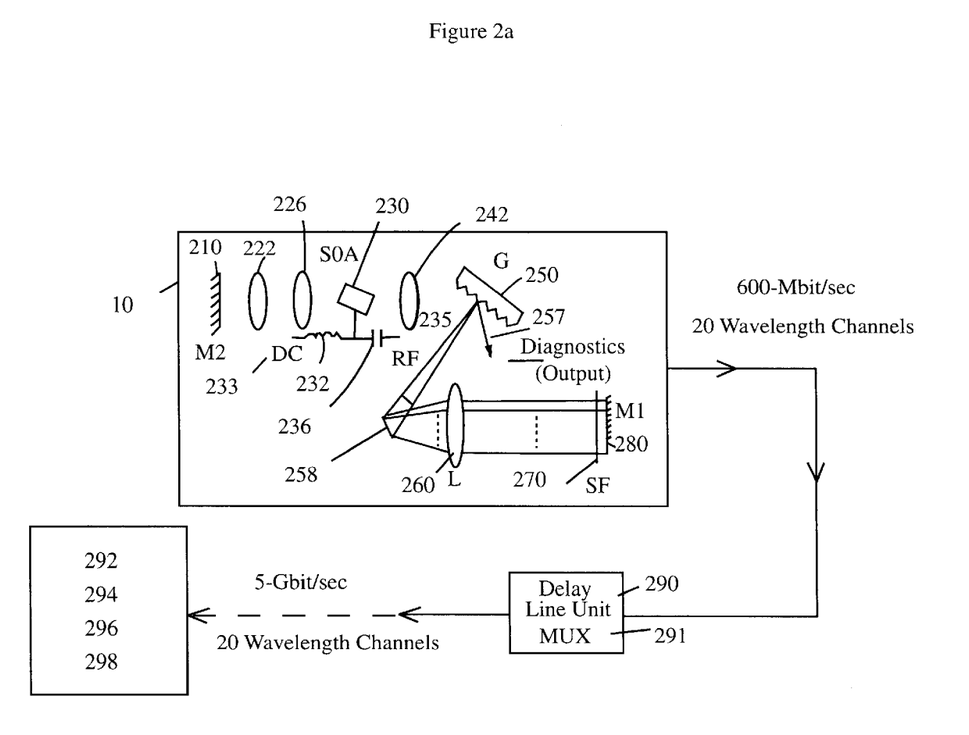
FIG. 2a is a schematic setup of the multiwavelength modelocked semiconductor diode laser transmitter capable of up of the generation of up to 20 simultaneous wavelength channels (the output of which is connected to a delay line unit including a multiplexer).

FIG. 2a is a schematic of the multiwavelength modelocked semiconductor diode laser transmitter system 200. SOA, semiconductor optical amplifier 230, can be a GaAs (gallium arsenide), AlGaAs(aluminum gallium arsenide), and the like. G grating 250 can be approximately 1800 lines per mm. Spatial filter, SF 270 can be a spatial transmission mask with variable intensity transmission, variable phase delay(or optical path length) or a combination of both amplitude and phase variation. Lens, L 260 can be a 150 mm achromatic lens for collimating and focussing the light. M2, 210 and M1, 280 are end mirrors. Lenses 222, 226, and 242 can be an 8 mm achromatic lens for collimating and focussing the light. Resistor 232 and capacitor 236 can be configured as a bias tee, such the ones manufactured by Mini Circuits. DC bias 233 can be approximately 172 mA. RF sinusoidal signal 235 can have a frequency of approximately 600 MHz. Component 258 can be a broadband reflective mirror. Multiplexer 290 can be a configuration of 3 cascaded modified Michelson interferometers, or any type of optical splitters such as but not limited to beam splitters, and the like. Multiplexer 290 can further be an optical delays such as but not limited to retroreflecting corner cubes with mechanical position stages, and the like. Multiplexer 290 can further be an optical recombiners such as but not limited to beamsplitters, recombiners, and the like.

FIG. 2a schematically shows the setup 200 of actively modelocked optical pulses generated from an angled-strip GaAs/AlGaAs SOA 230 by incorporating an intracavity spectral filter 270 to define the individual spectral components. In FIG. 2a, components 210 through 280 correspond to the multiwavelength laser 10 shown in FIG. 1. Referring to FIG. 2a, the end mirror M1 280 reflects the selected spectral components back to the gain device 230 to complete the multiple wavelength generation. A co-linear composite multiwavelength pulse train is coupled out from the zeroth order grating reflection 250 for diagnostics 257. Modelocking occurs by injecting approximately 1W of an RF sinusoidal signal 235 at a frequency of approximately 600 MHz with approximately 172 mA of DC bias current 233 into the diode chip 230, while diode chip 230 is impedance-matched for optimum power delivery.

Figure 2B:
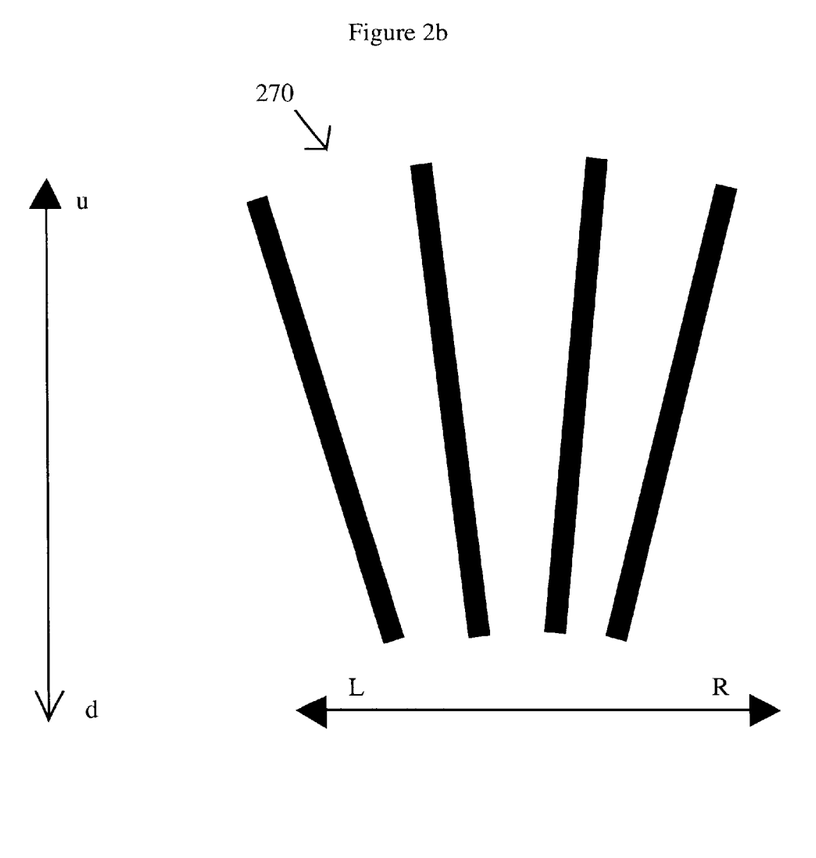
Figure 3A:
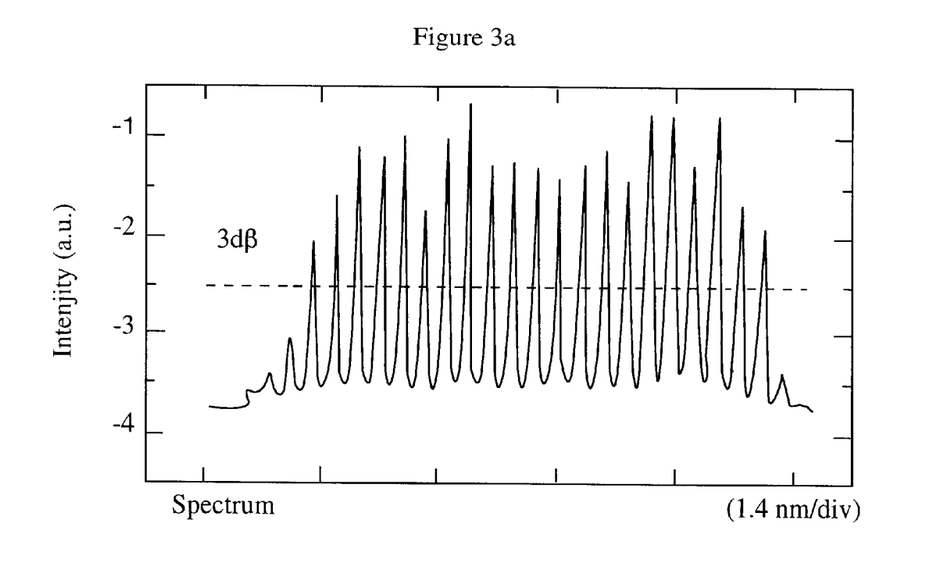
Figure 3B:
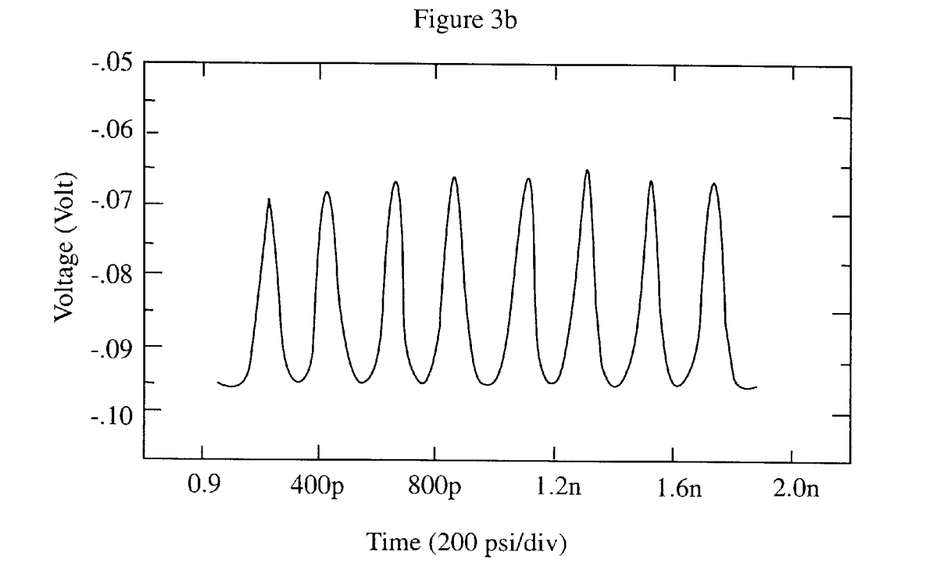

FIG. 2b shows the filter mask 270 that can be used with the embodiment 200 of FIG. 2a. The filter mask 270 can be constructed as a pure amplitude mask with more than 20 slits to accommodate 20 wavelength channels with wavelength spacing of approximately 0.52 nm. Referring to FIG. 2a, the black lines represent areas where light can pass through the mask. The horizontal direction is parallel to the direction of spectral dispersion determined by the grating; the vertical direction is perpendicular to the dispersion plane determined by the grating. The operation of the components in FIG. 2a will now be described.

Referring to FIG. 2a, light is generated in SOA 230 with dc bias current 232. The light is collected and collimated by lenses 226 and 242. Light is focussed on to mirror M2-210 using lens 222. This light is then reflected back into the gain medium by retracing the optical path. Light from 242 is directed to grating G-250. The diffracted light is directed to the spectral filter which is comprised of lens 260, spatial filter 270, and mirror M1-280. The specularly reflected light(the zeroth order diffracted light) is sent to the diagnostic 253. The reflected light from mirror M1-280 is directed back into the gain element 230 by retracing the optical path. This completes the optical cavity. The bias current 233, passed through cap 232 is increased to 175 mA to bring the laser cavity close to lasing threshold. An additional RF current 235 is applied to modulate the gain at a rate that is inversely proportional to the round trip time. This additional current establishes modelocking. The twenty wavelengths are defined by the optical filter. As modelocking occurs, it is transient unsaturated gain which allows the simultaneous production of the multiple wavelength. When the wavelengths are equally spaced, nonlinear four wave mixing occurs in the SOA chip 30 which produces four wave mixing components that are injected into the lasing wavelengths. This effect contributes to establishing as phase relation between the independent wavelength channels. The zeroth reflection 253 is also used as the output 285. The light is then passed through the multiplexer unit 290 to increase the pulse repetition frequency. G grating 50 can be approximately 1800 lines per mm. SF 70 (Spatial filter) is a transmission mask which can be fabricated photographically, or can be construed by fabricating thin slits in a thin, optically opaque medium. The mask can be a transmission mask, a phase mask, or a combination of amplitude and phase masks. Lens 60 can be a 150mm achromatic lens, end mirrors M2, 10 and M1, 80. Lens 22 can be a 8 mm focal length lens for collimating or focusing the light from a laser diode. Lens 26 can be a 8 mm focal length lens for collimating or focusing the light from a laser diode. Lens 42 can be a 8 mm focal length lens for collimating or focusing the light from a laser diode. Resistor 32 and capacitor 36 are found in commercially available bias tees from Mini Circuits, Hewlett Packard, or Picosecond Plus Labs. (the resistor-capacitor combination is a "bias tee"). DC bias 33 can be approximately 175 mA, and RF sinusoidal signal 35 can have a frequency of approximately 2.5 GHz.

Diagnostics 257 can pass to external components such as a spectrometer 292 such as a Jarrel Ashe spectrometer or a Hewlett Packard Optical Spectrum Analyzer, and a diode array 294 such as a linear detector array such as a silicon detector array manufactured by Epitaxial Products, E.G.&G, or Princeton, that are used to measure the optical spectrum. Diagnostics 257 can further include a high speed sampling oscilloscope 298 such as a Tektronix high speed sampling oscilloscope, and a high speed photodetector 296 such as a Picometrix pin photodiode with 20 picosecond response time, which is used to measure the optical pulse train. Diagnostics 257 can further include an external optical autocorrelator, such as a commercially available autocorrelator from Femtochrome, which measures individual optical pulse characteristics.

Referring to FIG. 2a, the output spectrum can be monitored using a spectrometer 292 in conjunction with a diode array 294, while the temporal characteristics can be measured using a fast photodetector 296 with a sampling oscilloscope 298 and nonlinear optical autocorrelation techniques. Nonlinear optical autocorrelation techniques is a method that can provide information about the temporal intensity of a short optical pulse. This method uses a modified interferometer and nonlinear crystals such as Lithium Iodate(LiIO3)(manufactured by Femtochrome).

Figure 4:
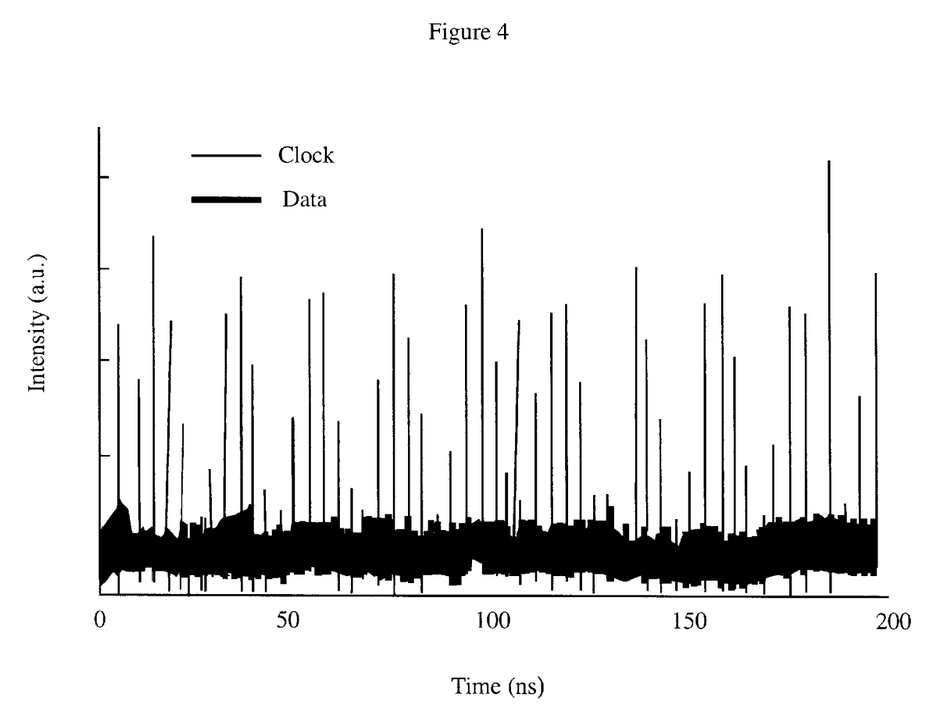
FIG. 4 is an oscilloscope trace of a recovered clock superimposed on the input data train.

The output of the modelocked diode laser 200 is directed into a temporal interleaver 291(delay unit 290) to achieve high pulse repetition rates between approximately 5 and approximately 15 GHz. As earlier discussed, an ultrafast optical demultiplexer 28 is required in FIG. 1. Temporal interleaver 291 can be comprised of beamsplitters and optical delays to generate a pulse train and subsequently combine them with an appropriate delay, to increase the overall repetition rate of the pulse train. For that purpose, an optical clock recovery oscillator 22, based on a passively modelocked semiconductor is employed, such as a well known optical recovery circuit shown in FIG. 1 of U.S. Pat. No. 5,548,433 to Smith, which is incorporated by reference. The well known optical clock recovery can be achieved by injecting light from a modulated data stream 26A into the passively modelocked laser of the optical clock recovery oscillator 22, with output clock pulses passing out at arrow 22A. Arrows 18A, 26A, 22A, 26B, and 28A show the direction through the nonlinear optical loop 24. For this application, a small amount of optical power from the WDM-TDM laser transmitter 10 is used to injection lock the passively modelocked diode laser. Typical operating modes of the optical clock recovery oscillator are minimum injection powers of 3 microwatts for robust recover, a fractional locking bandwith of approximately $3 \times 10^{-3}$, immunity to bit patterns of $2^{50}-1$, and >8:1 data to clock rate conversion. To demonstrate the robustness of the clock recovery oscillator 22, FIG. 4 shows and oscilloscope trace of clock recovery with repetitive data packets containing a single login "one-"data bit followed by 49 clock cycles of logic zero. The generation of stable clock recovery suggests that the clock recovery process is immune to pseudo random bit patterns of greater than $2^{50}-1$.

Figure 5A:
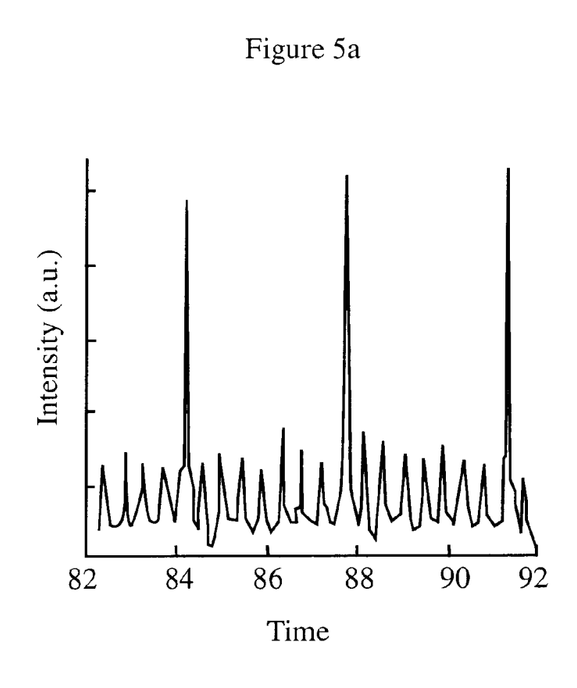
FIG. 5a is an oscilloscope trace of the capability of rate conversion of the optical clock recovery oscillator of FIG. 1.

The capability of rate conversion is shown in FIG. 5a. In this oscilloscope trace, the data transmitter is displayed operating at a rate equal to eight times the free running clock rate, along with the recovered, synchronized optical clock pulse train. This shows the ability of the clock recovery process to lock onto a signal with a data rate equal to a multiple of the fundamental clock rate, thus enabling the clock to be employed in demultiplexing applications. Upon achieving robust clock recovery, the subsequently generated optical modelocked optical pulses are amplified in a semiconductor optical amplifier and used as control pulses in a nonlinear amplifier asymmetrically displaced from the center of the optical loop. Typical launch pulse energies into the optical switch are approximately 10pJ, not including coupling losses into the SOA. Upon achieving robust clock recovery, the subsequently generated clock pulses are amplified in a semiconductor optical amplifier and are used as control pulses in an all optical switch shown and described in reference to FIG. 6. The optical switch consists of a nonlinear optical loop mirror with a semiconductor optical amplifier asymmetrically displaced from the center of the loop. Complete data switching is achieved with control pulse energies as low as 1.6 picojoules, not including coupling losses in the semiconductor optical amplifier.

Figure 5B:
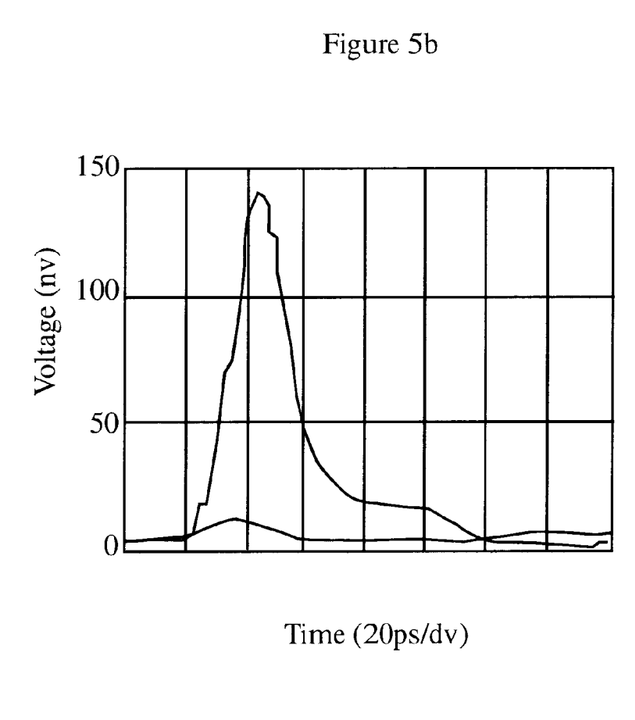
FIG. 5b is an oscilloscope trace showing the performance of the all optical switch of FIG. 1.

FIG. 5b is an oscilloscope trace showing the performance of the all optical switch. FIG. 5b shows the temporal output of the optical switch when an optical logic pulse of state "one" is present at the input of the switch. The two traces represent the output of the switch when the control; or switching pulse is either present or absent. The relative ratio of the peak detected signal represents the switching contrast, which in this case is greater than approximately 10 dB.

Figure 6:
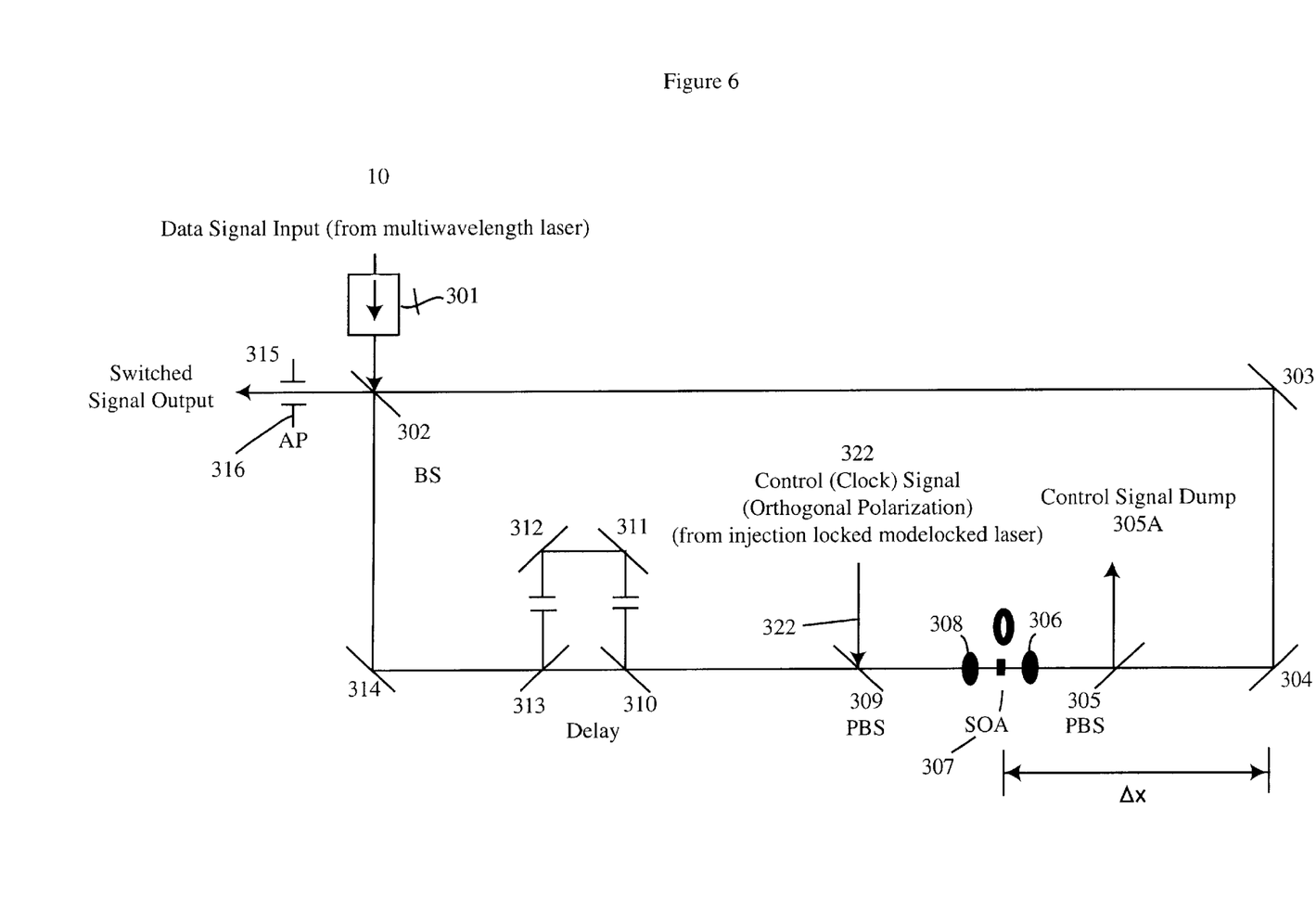
FIG. 6 shows a multiwavelength optical switch based on a nonlinear optical loop mirror that uses a semiconductor optical amplifier as the nonlinear optical element.

The multiwavelength optical switch depicted in FIG. 6 is based on a nonlinear optical loop mirror that uses a semiconductor optical amplifier 307 as the nonlinear optical element. The operation of the switch is schematically represented in FIG. 6. It should be noted that the same functionality can be achieved by employing all fiber based optical components. Multiwavelength data packets, which are generated from the multiwavelength laser transmitter 10 are injected into the nonlinear loop(comprised of beamsplitter 302, mirrors 303, 304, polarization beam splitters 305, 309, semiconductor optical amplifier 307, lenses 306, 308, optical delay(mirrors 310, 311, 312, 313) and mirror 314. Control or grating pulses 322 are generated from the injection modelocked laser 10. The output 305A of the injection modelocked control laser 322 injected into an out of the nonlinear loop using polarizing beam splitters 305, 309, respectively. The position of the SOA 307 is placed off-center x in the loop. The control pulse 322 induces an index change so that the data pulse is ejected out 315 of the loop at beamsplitter 302. It should be noted that without the control pulse 322, the data pulses are reflected back toward the multiwavelength laser 10 and are blocked or filtered out by isolator 301. Aperture 316 is used to spatially filter the output signals for achieving high switching contrast. The mirrors, isolator, aperture and polarizing beamsplitters are commercially available off the shelf from Newport Corporation. The SOA 307 can be the same as SOA 230.

Figure 5C:
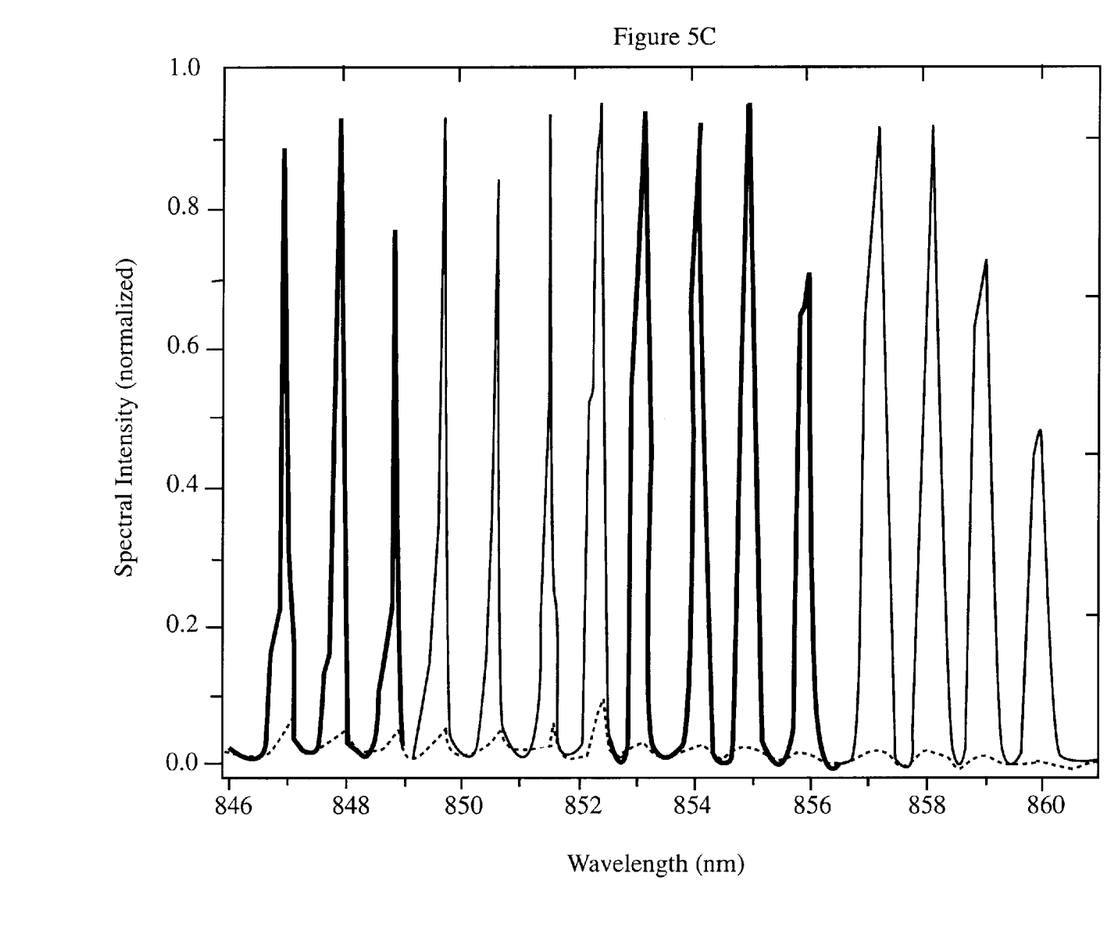
FIG. 5c is an oscilloscope trace showing the operation of the optical switch(wavelength domain).

FIG. 5c shows multiwavelength switching across a wide spectral bandwidth with high contrast. The solid trace shows the output of the switch in its "on" state, when a control pulse 322 is present, showing the presence of the multiples wavelength channels being switched at the output. The dashed trace shows the switch in its "off" state when a control pulse 322 is absent, showing a minimal amount of light leakage through the switch. The switching contrast ranging from approximately 13 to approximately 23 dB is measured in the spectral domain, illustrating the capability of switching, routing and processing multiwavelength channels in parallel, simultaneously.

The correlated temporal synchronization described above has applications in optical clock recovery 22 shown in FIG. 1, and synchronized WDM networks. The optical clock recovery can be a generation of a train of stable optical pulses 22A at a well defined repetition rate by injecting an optical data stream 26A into a passively modelocked laser which is part of optical clock recovery oscillator 22. The synchronized WDM network can be a network of optical fiber links and switches which use plural wavelengths which are pulsed at a well defined repetition rate to send optical data. The WDM-TDM network is a network of optical fiber links and switches which use many wavelengths which are pulsed at a selected repetition rate and that the optical pulses can be temporally interleaved with each other to send optical data.

Furthermore, the ultrafast temporal modulation shows that intracavity dynamics plays a role in establishing phase coherence across the composite multiwavelength spectrum.

In addition, the foregoing invention shows that modelocked multiwavelength single-stripe diode laser can be useful WDM-TDM generators of multifrequency wavelengths networks such as the optical links described above.

Although the mutiwavelength laser generator and the passively modelocked diode laser for demultiplexing are described using semiconductor laser diodes such as GaAs and AlGaAs, and the like; other lasers can be used such as but not limited to optical fiber lasers such as erbium, praesodimium, and the like. Solid state lasers can also be used such as but not limited to YAG, fosterite, LiSAF, and Ti:$Al_2O_3$, and be used. Other semiconductor lasers can also be used such as but not limited to vertical cavity lasers, InP, InGaAs, InGaAsP, GaN, InGaAlN, and the like. Still other semiconductor lasers can be used such as InAlGaAs, and InAlGaP, and the like. Still other lasers can be used such as but not limited to diode pumped lasers, gas lasers, waveguide lasers, and the like.

In summary, it has been shown that there are now, as a result of employing a hybrid WDM-TDM modelocked multiwavelength semiconductor, optical links capable of generating over 20 independent wavelength channels at rates greater than 5 Gbit/s which lead to optical data and transmission lines systems operating at rates in excess of approximately 800 Gbit/s.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. An optical data transmission system, the system having a laser source, means for actively modelocking the laser source to simultaneously generate up to approximately 4 wavelength channels, the improvement comprising:

means for simultaneously generating up to approximately 21 wavelength channels from the laser source;

means for multiplexing the channels;

means for optically amplifying the multiplexed channels; and an optical clock recovery means having:

means for splitting data signals from the channels into a first data path, and a second data path of multiwavelength data;

means for recovering optical clock pulses from the first path; and means for demultiplexing the optical clock pulses and the multiwavelength data from the second data path, wherein the multiplexer means and the optical amplifier means and the optical clock recovery means increases each of the modelocked wavelengths up to approximately 40 Gbits/s, and form an output having an aggregate rate of up to approximately 840 Gbits/sec.

2. The system of claim 1, wherein the laser source includes:

a single stripe semiconductor diode laser.

3. The system of claim 1, further comprising:

a means for data modulating each frequency of the multiwavelength channels whereby resulting data is transmitted in an R-Z data format.

4. The system of claim 1, wherein the optical clock recovery means includes:

a passively modelocked laser.

5. The system of claim 2, wherein the diode laser includes: Ga As.

6. The system of claim 2, wherein the diode laser includes: AlGaAs.

7. The system of claim 1, wherein the wavelength channels each include:

approximately 12 picosecond pulses at a rate of approximately 600 MHz.

8. The system of claim 1, wherein each of the channels include: a spacing between approximately 0.8 nm and approximately 2.1 nm.

9. The system of claim 1, wherein a portion of the optical power of the WDM-TDM transmitter is used to injection lock the modelocked diode laser.

10. A method for transmitting optical data from a laser source, the device having the steps of generating up to approximately 4 wavelength channels from the device, the improved method comprising the steps of:

simultaneously generating up to approximately 21 wavelength channels from the laser source;

multiplexing the channels;

optically amplifying the channels;

splitting data signals from the channels into a first data path, and a second data path of multiwavelength data;

recovering optical clock pulses from the first path; and demultiplexing the optical clock pulses and the multiwavelength data from the second data path, wherein the multiplexing, the optically amplifying, the splitting data signals, the recovering of the optical clock pulses and the demultiplexing of the optical clock pulses and the multiwavelength data increases each of the wavelength channels of up to approximately 40 Gbits/s, to form an output having an aggregate rate of up to approximately 840 Gbits/sec.

11. The method for transmitting data of claim 10, wherein the wavelength channels each include:

approximately 12 picosecond pulses at a rate of approximately 600 MHz.

12. The method for transmitting data of claim 10, wherein each of the channels include:

a spacing between approximately 0.8 nm and approximately 2.1 nm.

13. The method for transmitting data of claim 10, further including the steps of:

switching and routing the multiple wavelength channels simultaneously.

14. The method for transmitting data of claim 10, further including the steps of:

switching and routing the multiple wavelength channels in parallel.

15. The system of claim 2, wherein the diode laser includes:

InP.

16. The system of claim 2, wherein the diode laser includes:

InGaAl.

17. The system of claim 2, wherein the diode laser includes:

InGaAs.

18. The system of claim 12, wherein the injection locked passive modelocked laser creates control pulses for demultiplexing.

* * * * *